(12) United States Patent
Pei et al.

(10) Patent No.: US 8,409,989 B2
(45) Date of Patent: Apr. 2, 2013

(54) STRUCTURE AND METHOD TO FABRICATE A BODY CONTACT

(75) Inventors: Chengwen Pei, Hopewell Junction, NY (US); Roger Allen Booth, Jr., Hopewell Junction, NY (US); Kangguo Cheng, Albany, NY (US); Joseph Ervin, Hopewell Junction, NY (US); Ravi M. Todi, Hopewell Junction, NY (US); Geng Wang, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 96 days.

(21) Appl. No.: 12/944,174

(22) Filed: Nov. 11, 2010

(65) Prior Publication Data
US 2012/0119310 A1    May 17, 2012

(51) Int. Cl.
*H01L 29/72* (2006.01)
(52) U.S. Cl. ........ 438/682; 438/149; 438/643; 438/647; 438/649; 438/657; 438/855; 257/347; 257/401; 257/413; 257/751; 257/774; 257/778
(58) Field of Classification Search .......... 438/149, 438/643, 647, 649, 855, 657, 682; 257/347, 257/401, 413, 751, 755, 774, 778
See application file for complete search history.

(56) References Cited

U.S. PATENT DOCUMENTS

| | | | |
|---|---|---|---|
| 5,304,831 A | 4/1994 | Yilmaz et al. | |
| 5,429,964 A | 7/1995 | Yilmaz et al. | |
| 5,915,167 A | 6/1999 | Leedy | |
| 6,133,640 A | 10/2000 | Leedy | |
| 6,208,545 B1 | 3/2001 | Leedy | |
| 6,551,857 B2 | 4/2003 | Leedy | |
| 6,563,224 B2 | 5/2003 | Leedy | |
| 6,632,706 B1 | 10/2003 | Leedy | |
| 6,686,627 B2 | 2/2004 | D'Anna et al. | |
| 6,838,731 B1 | 1/2005 | D'Anna et al. | |
| 7,129,138 B1 | 10/2006 | Furukawa et al. | |
| 7,138,295 B2 | 11/2006 | Leedy | |
| 7,193,239 B2 | 3/2007 | Leedy | |
| 7,474,004 B2 | 1/2009 | Leedy | |
| 7,504,732 B2 | 3/2009 | Leedy | |

(Continued)

FOREIGN PATENT DOCUMENTS

| CN | 1525485 | 4/1998 |
|---|---|---|
| CN | 101188235 | 4/1998 |

(Continued)

OTHER PUBLICATIONS

Kuehne, Stephen C., et al.; SOI MOSFET with Buried Body Strap by Wafer Bonding; IEEE Transactions on Electron Devices, vol. 45, No. 5, May 1998; pp. 1084-1091.

*Primary Examiner* — Edward Wojciechowicz
(74) *Attorney, Agent, or Firm* — Howard M. Cohn; Katherine S. Brown

(57) ABSTRACT

A structure and method to fabricate a body contact on a transistor is disclosed. The method comprises forming a semiconductor structure with a transistor on a handle wafer. The structure is then inverted, and the handle wafer is removed. A silicided body contact is then formed on the transistor in the inverted position. The body contact may be connected to neighboring vias to connect the body contact to other structures or levels to form an integrated circuit.

12 Claims, 7 Drawing Sheets

U.S. PATENT DOCUMENTS

| | | |
|---|---|---|
| 7,670,896 B2 | 3/2010 | Zhu et al. |
| 7,687,348 B2 | 3/2010 | Tani |
| 7,704,811 B2 | 4/2010 | Houston |
| 7,705,466 B2 | 4/2010 | Leedy |
| 7,767,529 B2 | 8/2010 | Venkatraman et al. |
| 2002/0132465 A1 | 9/2002 | Leedy |
| 2003/0173608 A1 | 9/2003 | Leedy |
| 2005/0280088 A1 | 12/2005 | Min et al. |
| 2008/0067584 A1 | 3/2008 | Lui et al. |
| 2008/0067591 A1 | 3/2008 | Tani |
| 2008/0258210 A1 | 10/2008 | Venkatraman et al. |
| 2009/0067210 A1 | 3/2009 | Leedy |
| 2009/0174082 A1 | 7/2009 | Leedy |
| 2009/0175104 A1 | 7/2009 | Leedy |
| 2009/0218700 A1 | 9/2009 | Leedy |
| 2009/0219742 A1 | 9/2009 | Leedy |
| 2009/0219743 A1 | 9/2009 | Leedy |
| 2009/0219744 A1 | 9/2009 | Leedy |
| 2009/0219772 A1 | 9/2009 | Leedy |
| 2009/0230501 A1 | 9/2009 | Leedy |
| 2010/0171224 A1 | 7/2010 | Leedy |
| 2010/0171225 A1 | 7/2010 | Leedy |
| 2010/0172197 A1 | 7/2010 | Leedy |
| 2010/0173453 A1 | 7/2010 | Leedy |
| 2010/0224876 A1 | 9/2010 | Zhu |
| 2011/0201151 A1 * | 8/2011 | Gambino et al. ............. 438/107 |

FOREIGN PATENT DOCUMENTS

| | | |
|---|---|---|
| CN | 98803836 | 6/2004 |
| EP | 0975472 | 4/1998 |
| EP | 1986233 | 4/1998 |
| JP | 10-543031 | 4/1998 |
| JP | 2008028407 | 8/2007 |
| JP | 2008166831 | 7/2008 |
| JP | 2008166832 | 7/2008 |
| JP | 2008172254 | 7/2008 |
| KR | 10-0639752 | 10/2006 |
| KR | 10-0785821 | 12/2007 |
| TW | 412854 | 11/2000 |

\* cited by examiner

US 8,409,989 B2

STRUCTURE AND METHOD TO FABRICATE A BODY CONTACT

FIELD OF THE INVENTION

The present invention relates to integrated circuit structures and fabrication methods, and more particularly to creating conducting contacts to transistor structures in semiconductor devices.

BACKGROUND OF THE INVENTION

Metal-Oxide Semiconductor Field Effect Transistors ("MOSFETs") are a common type of semiconductor device. A MOSFET device includes a source region, a drain region, a channel region extending between the source and drain regions, and a gate structure adjacent to the channel region. The gate structure includes a conductive gate electrode layer adjacent to and separated from the channel region by a thin dielectric layer. When a voltage of sufficient strength is applied to the gate structure to place the MOSFET device in an on state, a conduction channel region forms between the source and drain regions thereby allowing current to flow through the device. When the voltage that is applied to the gate is not sufficient to cause channel formation, current does not flow and the MOSFET device is in an off state.

Three-dimensional (3D) integration of semiconductor chips typically employs through-substrate vias (TSVs) that connect the front side of a semiconductor chip to a back side of the same semiconductor chip. Multiple semiconductor chips may be vertically stacked employing the through-substrate vias (TSVs). Such three-dimensional integration of semiconductor chips provides a higher device density per area than a single semiconductor chip without any vertical stacking, and reduces the size of a packaging substrate correspondingly.

When MOSFETs are used in a 3D integration scheme, contact resistance may be important, depending on the application. Therefore, it is desirable to have a structure and method for forming a contact with reduced contact resistance that is compatible with a 3D integration scheme.

SUMMARY

In one embodiment of the present invention, a method is provided for fabricating a body contact on a transistor having a body, source, drain, and gate, and disposed on a dielectric layer. The method includes forming a cavity in the dielectric layer to expose a portion of the body of the transistor, forming a silicide layer on the exposed portion of the body, and disposing a layer of polysilicon on the exposed portion of the body.

In another embodiment of the present invention, a method is provided for fabricating a body contact on a transistor having a body, source, drain, and gate and disposed on a dielectric layer. The method includes forming a cavity in the dielectric layer to expose a portion of the body of the transistor, forming a cavity in the dielectric layer to expose an active silicon area, forming a silicide layer on the exposed portion of the body, depositing a metal liner on the silicide layer, depositing a polysilicon layer on the exposed portion of the body, and forming a void in the polysilicon layer, the void disposed between the body and the active silicon area.

In another embodiment of the present invention, a semiconductor structure has a dielectric layer; a transistor, the transistor comprising a body, source, drain, and gate, wherein the transistor is disposed on the dielectric layer; a void formed in the dielectric layer, thereby exposing the body of the transistor; a silicide layer disposed on the body of the transistor; and a polysilicon layer disposed on the silicide layer.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a cross section view of a prior art semiconductor structure.

FIG. 2 shows a semiconductor structure after an inversion process step for a method in accordance with an embodiment of the present invention.

FIG. 3 shows a semiconductor structure after a handle wafer removal process step.

FIG. 4 shows a semiconductor structure after a mask deposition process step.

FIG. 5 shows a semiconductor structure after an etch process step.

FIG. 6 shows a semiconductor structure after a silicide process step.

FIG. 7 shows a semiconductor structure after a mask removal process step.

FIG. 8 shows a semiconductor structure after a metal deposition process step.

FIG. 8B shows an alternate embodiment of a semiconductor structure.

FIG. 9 shows another alternate embodiment of a semiconductor structure.

FIG. 10 is a flowchart indicating process steps for a method in accordance with an embodiment of the present invention.

Figure 11:
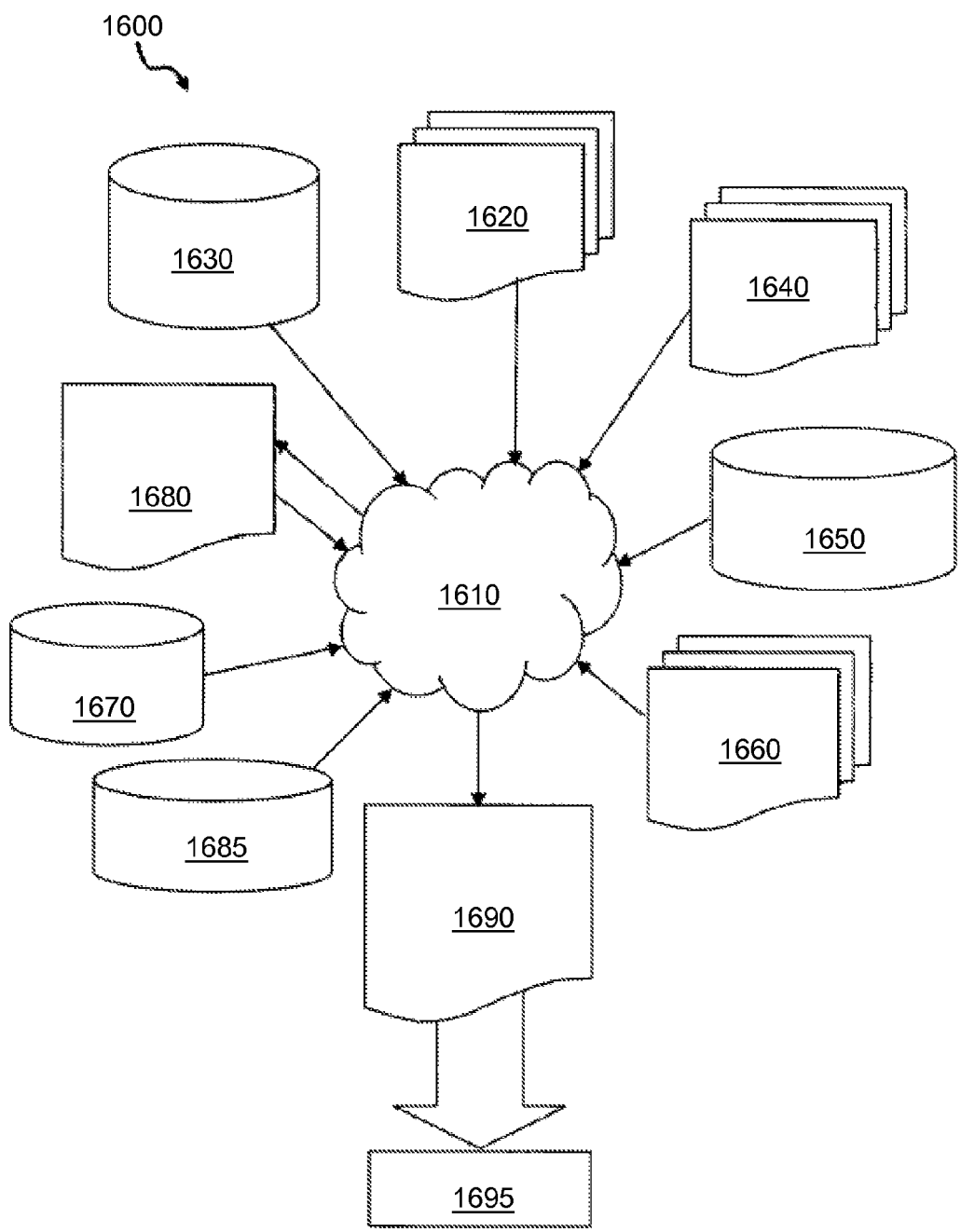

FIG. 11 shows a block diagram of an exemplary design flow.

DETAILED DESCRIPTION

Figure 1:
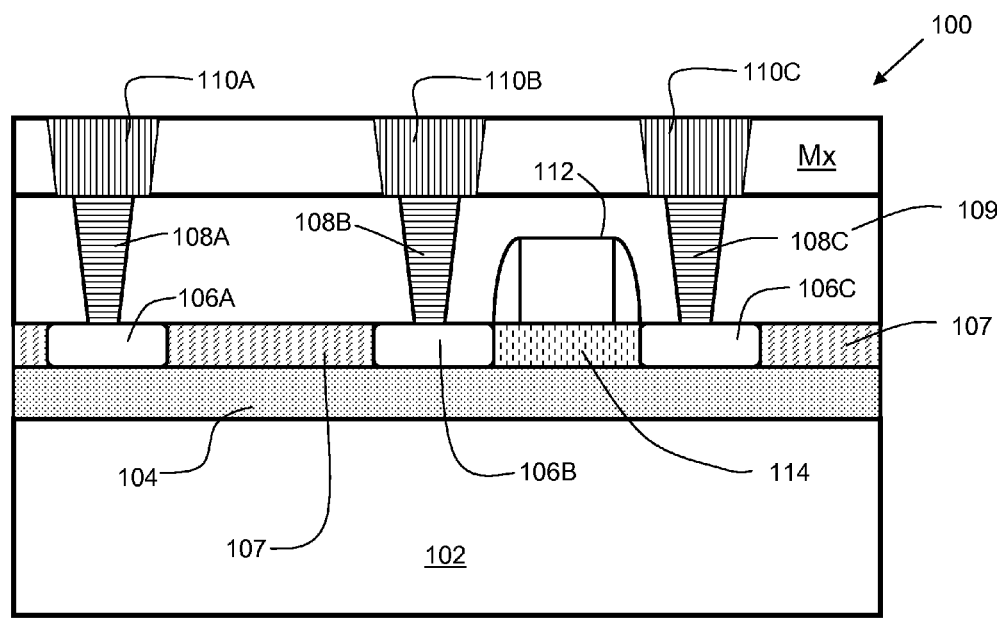

FIG. 1 is a cross section view of a prior art semiconductor structure 100.

Semiconductor structure 100 comprises handle wafer 102, which may be comprised of silicon. Handle wafer 102 is considered a "sacrificial" layer, in that it will be removed at a future processing step. Structure 100 comprises buried oxide layer (BOX) 104 which is disposed on handle wafer 102. Disposed on BOX layer 104 are a plurality of active silicon areas, indicated as 106A, 106B, and 106C. Shallow Trench Isolation (STI) areas 107 are adjacent to active silicon areas (referred to generally as 106), and are preferably comprised of oxide. Transistor 112 comprises transistor body region 114 and is disposed on BOX layer 104. Dielectric layer 109 is disposed on the STI regions 107 and active silicon areas 106, and over the transistor 112. Metal vias 108A, 108B, and 108C connect a metal layer (Mx) to the active silicon areas 106. Metal via 108A connects metal contact 110A to active silicon area 106A. Similarly, metal via 108B connects metal contact 110B to active silicon area 106B and metal via 108C connects metal contact 110C to active silicon area 106C.

Figure 2:
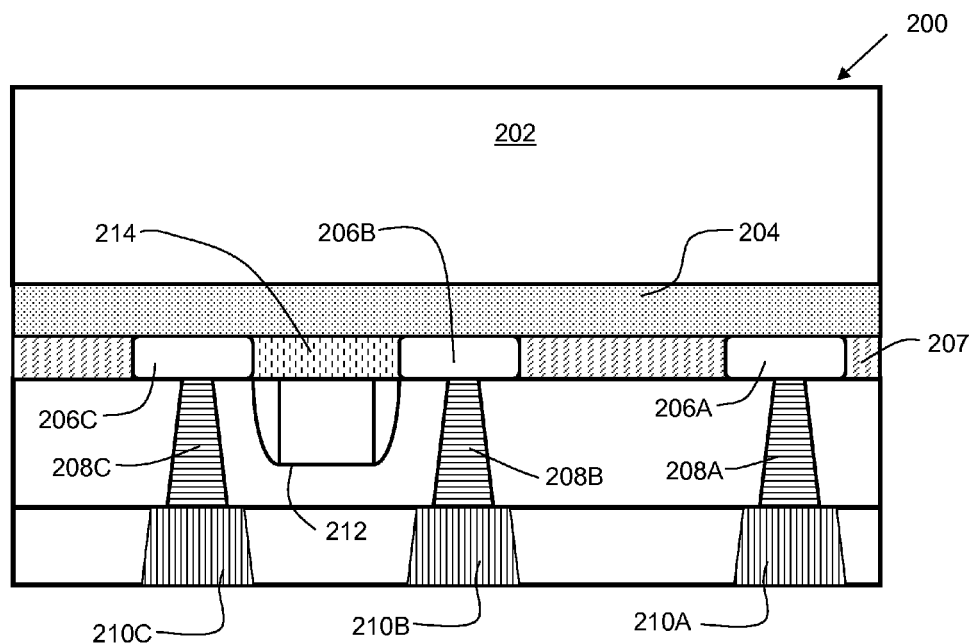

FIG. 2 shows a semiconductor structure 200 after an inversion process step for a method in accordance with an embodiment of the present invention. Semiconductor structure 200 is similar to semiconductor structure 100, except that is has been inverted, such that handle wafer 202 is now at the top of structure 200. As stated previously, in many cases, similar elements may be referred to by similar numbers in various figures (FIGs) of the drawing, in which case typically the last two significant digits may be the same, the most significant digit being the number of the drawing figure (FIG). For example, handle wafer 202 of FIG. 2 is similar to handle wafer 102 of FIG. 1, and metal contact 110A of FIG. 1 is similar to metal contact 210A of FIG. 2.

Figure 3:
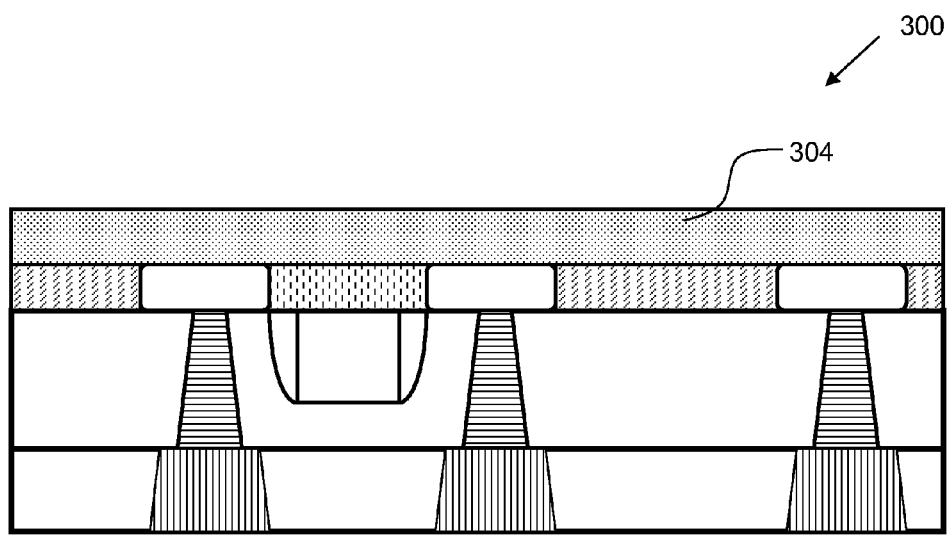

FIG. 3 shows a semiconductor structure 300 after a handle wafer removal process step. As compared with structure 200 of FIG. 2, the handle wafer is removed from semiconductor structure 300, such that BOX layer 304 is now the topmost layer of the semiconductor structure 300. In one embodiment, a chemical mechanical polish (CMP) process is used to remove the handle wafer. In another embodiment, a selective etch process is used to remove the handle wafer.

Figure 4:
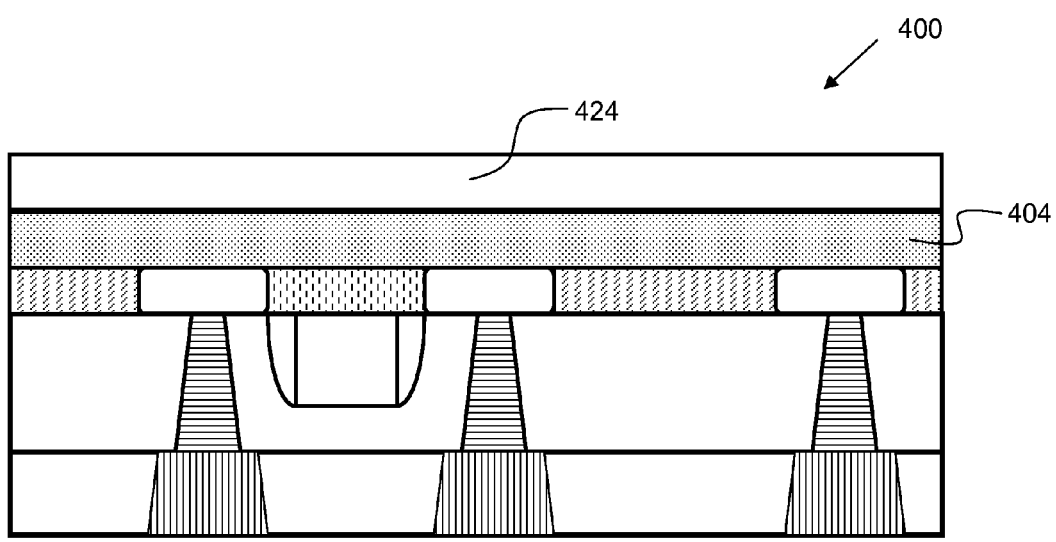

FIG. 4 shows a semiconductor structure 400 after a mask deposition process step. Mask layer 424 is disposed over BOX layer 404.

Figure 5:
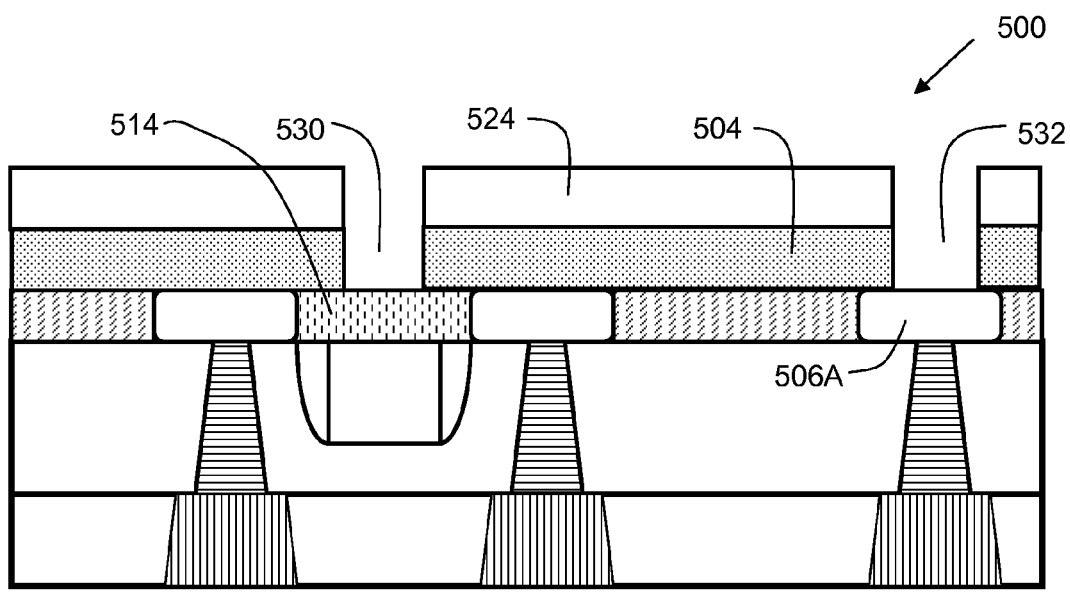

FIG. 5 shows a semiconductor structure 500 after a patterning and etch process step. After patterning mask layer 524, cavities 530 and 532 are etched into the box layer 504 to expose a portion of transistor body region 514 and active silicon area 506A. In one embodiment, the etch process is performed with a reactive ion etch.

Figure 6:
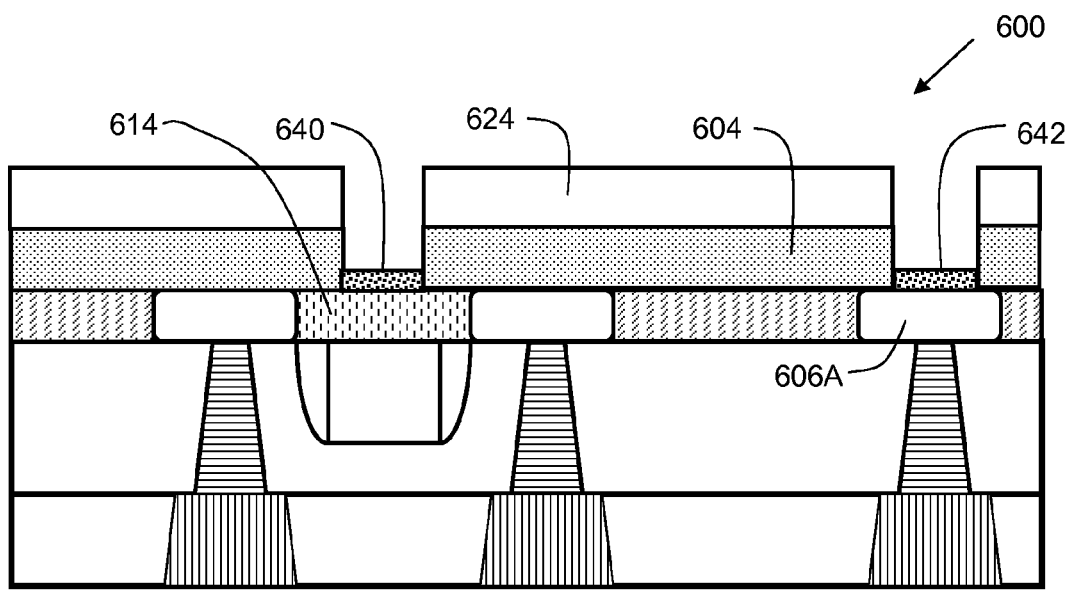

FIG. 6 shows a semiconductor structure 600 after a silicide process step. Silicide regions 640 and 642 are formed on the transistor body region 514 and active silicon area 506A, respectively. In one embodiment, silicide regions 640 and 642 are comprised of a nickel silicide. In another embodiment, silicide regions 640 and 642 are comprised of a cobalt silicide. Other silicide materials may also be used.

Figure 7:
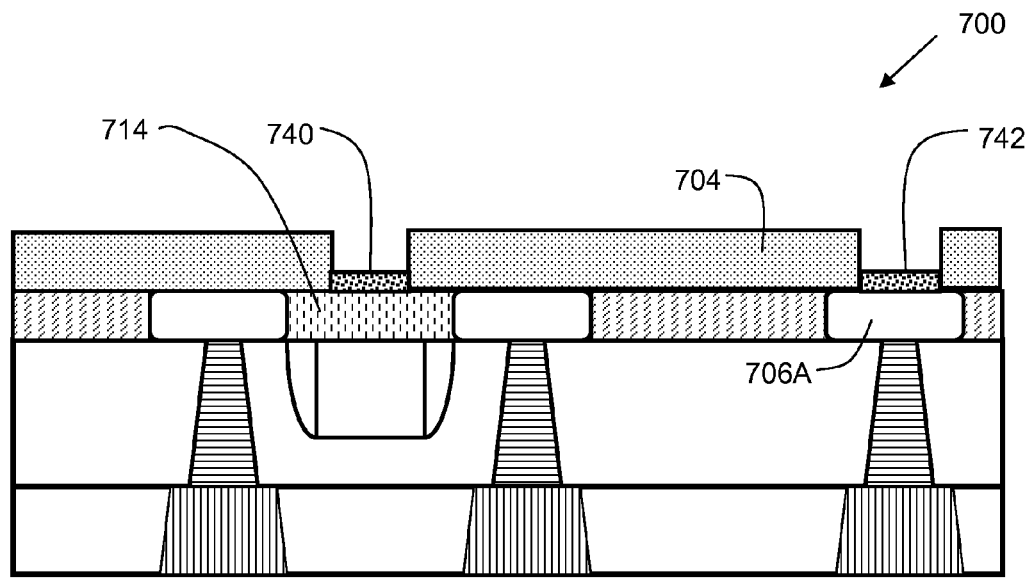

FIG. 7 shows a semiconductor structure 700 after a mask removal process step. On semiconductor structure 700, the mask layer (see 624 of FIG. 6) is removed. In one embodiment, a CMP process is used to remove the mask layer. In another embodiment, a selective etch process is used to remove the mask layer.

Figure 8:
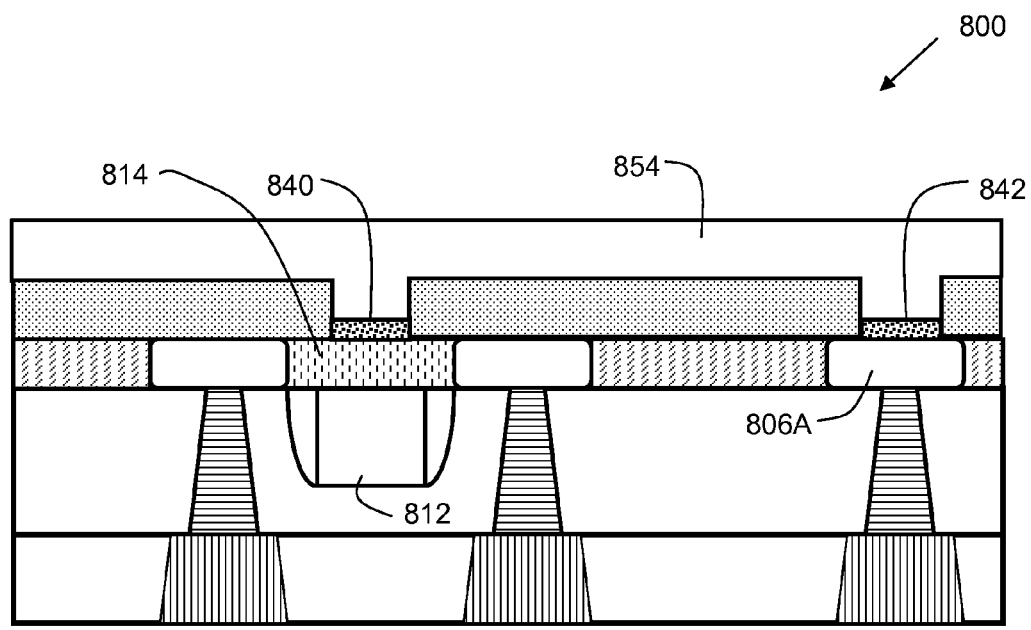

FIG. 8 shows a semiconductor structure 800 after a polysilicon deposition process step. In this process step, polysilicon layer 854 is deposited on the semiconductor structure 800, and makes contact with silicide regions 840 and 842. In one embodiment, polysilicon layer 854 is deposited via a chemical vapor deposition process.

Figure 8B:
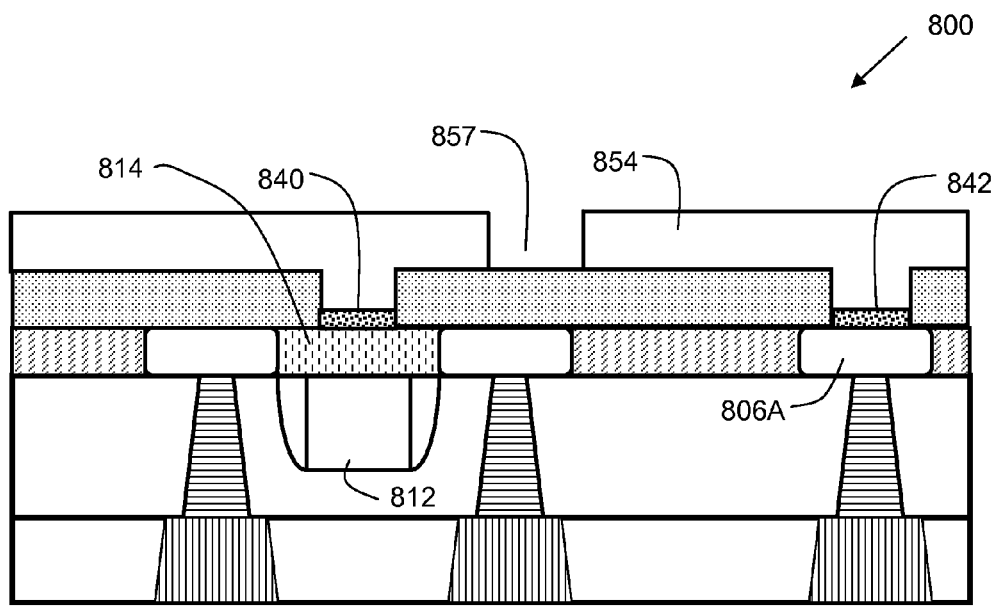

Note that as shown in FIG. 8, active silicon area 806A is electrically connected to transistor body region 814 of transistor 812. As shown in FIG. 8B, optionally, additional patterning can be performed on polysilicon layer 854 depending on the design of the integrated circuit being fabricated to form void 857 in polysilicon layer 854 which is disposed between the body region 814 and the active silicon area 806A. Void 857 prevents shorting elements together (e.g. transistor body 814 and active silicon area 806A) when such connections would violate the circuit design.

Figure 9:
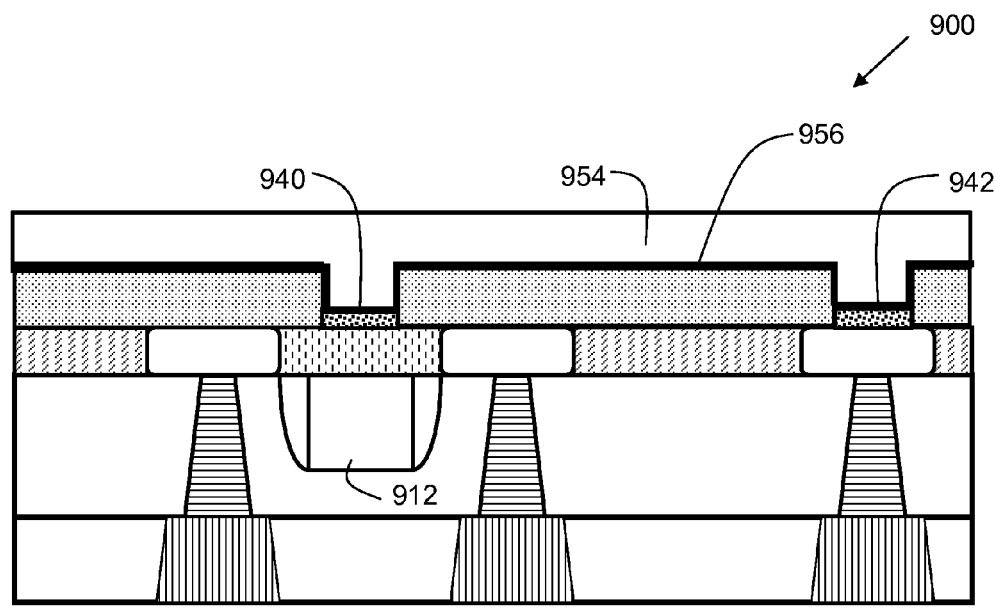

FIG. 9 shows an alternate embodiment of a semiconductor structure 900. Semiconductor structure 900 is similar to semiconductor structure 800, except that semiconductor structure 900 further comprises metal liner 956 disposed between the silicide regions 940 and 942 and the polysilicon layer 954. In one embodiment, metal liner 956 is comprised of titanium (e.g. such as titanium nitride (TiN)), copper, or aluminum. Other metals may also be used. In one embodiment, the metal liner 956 has a thickness in the range of 10 to 50 nanometers. Metal liner 956 may be deposited via a variety of methods, including, but not limited to, atomic layer deposition (ALD), Chemical Vapor Deposition (CVD), and sputtering.

Figure 10:
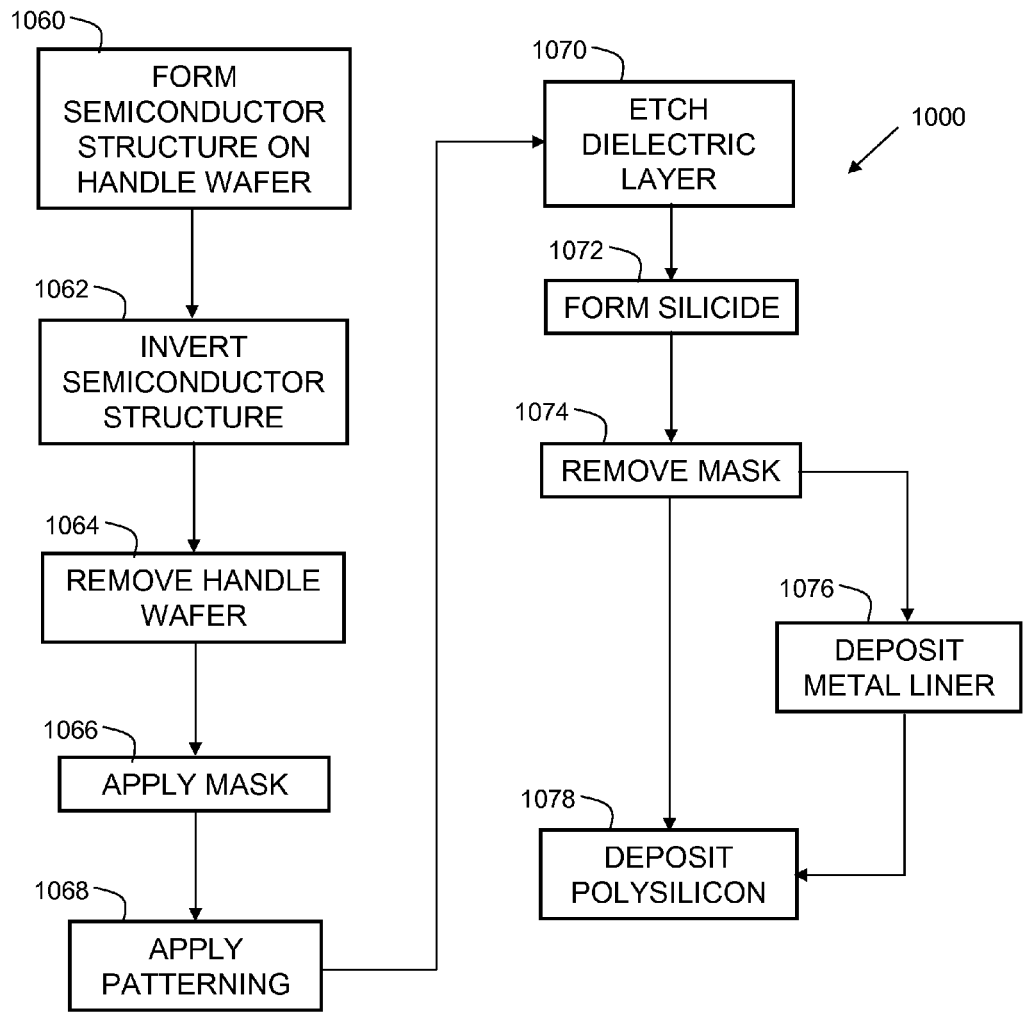

FIG. 10 is a flowchart 1000 indicating process steps for a method in accordance with an embodiment of the present invention. In process step 1060 a semiconductor structure is formed on a handle wafer, as depicted in FIG. 1. In process step 1062 the semiconductor structure is inverted, as depicted in FIG. 2. In process step 1064 the handle wafer is removed, as depicted in FIG. 3. In process step 1066 a mask layer is applied, as depicted in FIG. 4. In process step 1068 patterning is performed on the mask layer. In process step 1070, the BOX layer is etched to expose contact areas, as depicted in FIG. 5. In process step 1072 silicide is formed, as depicted in FIG. 6. In process step 1074 the mask layer is removed, as depicted in FIG. 7. In process step 1078 polysilicon is deposited, as depicted in FIG. 8. Optionally, prior to depositing the polysilicon in process step 1078, a metal liner is deposited in process step 1076. The resulting semiconductor structure with the metal liner is shown in FIG. 9.

FIG. 11 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 2-9. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 11 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 2-9. As such, design structure 1620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 2-9 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 2-9, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 2-9. Design structure 1690 may then proceed to a stage 1695 where, for example, design structure 1690: proceeds to tape-out, is released to manufacturing, is released to a mask house, is sent to another design house, and is sent back to the customer.

As can now be appreciated, embodiments of the present invention provide a space saving structure, where the body contact and silicide provide improved performance by having a lower resistance, while still supporting a 3D integration scheme. The low resistance is achieved by forming body contacts on the bottom side of the gate. The body contact is positioned much closer to the FET body, and also provides a larger contact connection area to the body than with a traditional contact. Higher density is achieved because there is no contact disposed above the gate, hence the metal levels can be formed closer together by using embodiments of the present invention. Regarding the alignment of various device layers, the alignment method may make use of deep trenches as alignment marks, or as an alternative, a regular mark shape in the CMOSFET process flow may also be utilized.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method for fabricating a body contact on a transistor having a body, source, drain, and gate, the transistor disposed on a dielectric layer, comprising:
    forming a cavity in the dielectric layer to expose a portion of the body of the transistor;
    forming a silicide layer on the exposed portion of the body;
    depositing a metal liner on the silicide layer;
    and depositing a layer of polysilicon on the metal liner.

2. The method of claim 1, further comprising: disposing the dielectric layer on a handle wafer; inverting the handle wafer; and removing the handle wafer, prior to forming a cavity in the dielectric layer to expose a portion of the body of the transistor.

3. The method of claim 2, further comprising: applying a mask layer over the dielectric layer; lithographically patterning the mask layer to form a void in the mask layer, above the exposed portion of the body; and wherein forming a cavity in the dielectric layer to expose a portion of the body of the transistor comprises etching the dielectric layer.

4. The method of claim 3, wherein etching the dielectric layer is performed with a reactive ion etch.

5. The method of claim 3, further comprising removing the mask layer after etching the dielectric layer.

6. The method of claim 1, wherein forming a silicide layer comprises forming a nickel silicide layer.

7. The method of claim 1, wherein forming a silicide layer comprises forming a cobalt silicide layer.

8. The method of claim 1, wherein the step of depositing a metal liner comprises depositing a liner comprising titanium.

9. The method of claim 1, wherein depositing a metal liner comprises depositing a liner comprising copper.

10. The method of claim 1, wherein depositing a metal liner is performed via atomic layer deposition.

11. The method of claim 1, wherein depositing a metal liner is performed via chemical vapor deposition.

12. A method for fabricating a body contact on a transistor having a body, source, drain, and gate, the transistor disposed on a dielectric layer, comprising:
- forming a cavity in the dielectric layer to expose a portion of the body of the transistor;
- forming a cavity in the dielectric layer to expose an active silicon area;
- forming a silicide layer on the exposed portion of the body;
- depositing a metal liner on the silicide layer;
- depositing a polysilicon layer on the metal liner; and
- forming a void in the polysilicon layer, the void disposed between the body and the active silicon area.

* * * * *